(12) United States Patent
O'Shaugnessy

(10) Patent No.: US 6,980,034 B2
(45) Date of Patent: Dec. 27, 2005

(54) ADAPTIVE, SELF-CALIBRATING, LOW NOISE OUTPUT DRIVER

(75) Inventor: Timothy Glen O'Shaugnessy, Elbert, CO (US)

(73) Assignee: Cadence Design Systems, Inc., San Jose, CA (US)

( * ) Notice: Subject to any disclaimer, the term of this patent is extended or adjusted under 35 U.S.C. 154(b) by 568 days.

(21) Appl. No.: 10/232,931

(22) Filed: Aug. 30, 2002

(65) Prior Publication Data

US 2004/0051391 A1 Mar. 18, 2004

(51) Int. Cl.$^7$ .............................. H03B 1/10; H03K 3/00
(52) U.S. Cl. ....................................... 327/111; 327/112
(58) Field of Search ........................ 327/108, 111, 112, 327/102

(56) References Cited

U.S. PATENT DOCUMENTS

| | | | |
|---|---|---|---|
| 4,783,601 A | 11/1988 | Hartgring et al. ........... 327/347 |
| 4,947,063 A | 8/1990 | O'Shaughnessy et al. .. 327/384 |
| 5,247,241 A * | 9/1993 | Ueda ........................ 323/312 |
| 5,510,744 A | 4/1996 | Lien .......................... 327/310 |
| 5,517,130 A | 5/1996 | Sandhu ....................... 327/27 |
| 6,016,081 A | 1/2000 | O'Shaughnessy ........... 331/48 |
| 6,127,746 A | 10/2000 | Clemente .................... 307/131 |
| 6,166,670 A | 12/2000 | O'Shaughnessy .......... 341/136 |
| 6,329,866 B1 | 12/2001 | Watarai ...................... 327/379 |
| 6,617,897 B2 * | 9/2003 | Lee ............................ 327/170 |

* cited by examiner

*Primary Examiner*—Quan Tra
(74) *Attorney, Agent, or Firm*—Burgess & Bereznak LLP

(57) ABSTRACT

An output buffer includes an output stage that includes a transconductance device configured to drive a capacitive load, and a first capacitor coupled to an input of the transconductance device. A converter converts an input clock signal into a current that is provided to charge the first capacitor during a specified interval. The converter includes a feedback loop to adjust the current so as to produce a specified logic level at the specified interval. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

24 Claims, 4 Drawing Sheets

ADAPTIVE, SELF-CALIBRATING, LOW NOISE OUTPUT DRIVER

FIELD OF THE INVENTION

The present invention relates generally to the field of integrated circuitry; more particularly, to circuits that drive large capacitances, such as interface circuits useful for outputting signals from an integrated circuit (IC) to an external bus, circuit or system.

BACKGROUND OF THE INVENTION

Numerous output driver circuits have been developed for integrated circuits and systems. In many cases, these driver circuit structures are designed to minimize noise for digital applications where the number of outputs is large, e.g., a 32-bit or 64-bit data bus or address bus. One source of noise in high performance logic circuits is a phenomenon known as "ground bounce", which typically occurs when a transient current passes through the package inductance, producing a voltage glitch or spike that can cause a logic error. Digital circuits normally produce transient noise when the output switches from one logic level to the complementary logic level. According to fundamental laws of physics, this type of transient noise increases whenever the package inductance increases, the transient time decreases, the capacitive load increases, or the number of drivers increases.

To combat the problem of ground bounce noise, circuit designers have tried a variety of different approaches, which include alteration of the package inductance, and circuit designs constrained to produce the smallest transient current possible. This latter approach to reducing noise involves controlling the transient current waveform of the output driver. An example of this design approach is disclosed in U.S. Pat. No. 4,947,063, which teaches reducing noise in an output driver by utilizing a ramp-shaped current pulse to change the output voltage. By way of further example, U.S. Pat. Nos. 4,947,063; 4,783,601; 5,510,744; 5,517,130; 6,127,746; and 6,329,866 disclose various structures and methods of output drivers exhibiting low noise performance.

The basic problem with past output driver circuit designs is that the magnitude of the ramped current pulse is often difficult to control precisely. This limitation on device performance is often due to variations that exist in manufacturing process parameters and device operating conditions (i.e., supply voltage, temperature, etc.). For instance, many prior art implementations still suffer from problems associated with process variation of resistance values, in which process fluctuations in sheet resistance value lead to significant variations (e.g., 25% to 50%) in current references of the output driver.

Variations across process or operating conditions in the magnitude of the ramped shaped current from an optimal value cause an increase in either the transient noise or transition delay. An increase in transition delay reduces timing margin, causes an increase in the error rate, or requires a reduction in the maximum data rate. Conversely, an increase in the transient noise voltage produces digital errors, which can cause a loss of data, or even produce catastrophic failure by way of latch-up in CMOS circuits. As process variations produce a wider variance in specific process parameters, the performance of the entire digital system thus decreases.

Therefore, what is needed is a new circuit topology and method that minimizes transient noise from digital switching by reducing sensitivity to process parameters.

BRIEF DESCRIPTION OF THE DRAWINGS

The present invention is illustrated by way of example, and not limitation, in the figures of the accompanying drawings, wherein.

DETAILED DESCRIPTION

An adaptive, self-calibrating, low noise output driver is described. In the following description, specific details are set forth, such as device types, sizes, voltage levels, etc., in order to provide a thorough understanding of the present invention. Practitioners having ordinary skill in the integrated circuit arts will understand that the invention may be practiced without many of these details. In other instances, well-known elements, device structures, and processing steps have not been described in detail to avoid obscuring the invention.

Figure 1:
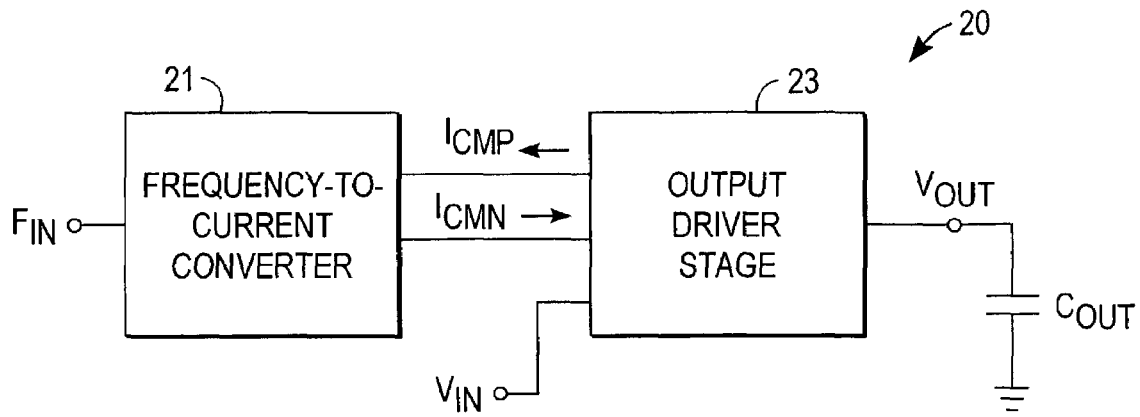
FIG. 1 is a block diagram of an output driver circuit according to one embodiment of the present invention.

Referring to FIG. 1, there is shown a block diagram of an output driver 20 according to one embodiment of the present invention. Output driver 20 comprises a frequency-to-current converter circuit 21 coupled with an output driver circuit stage 23. Output driver stage 23 drives an output node ($V_{OUT}$) having an associated capacitance ($C_{OUT}$). In a typical application, driver 20 is utilized in an integrated circuit to drive an output node coupled to external circuitry, e.g., an address or data bus. In this particular embodiment, output driver stage 23 provides a signal at $V_{OUT}$ that is the complement of an input logic signal, labeled $V_{IN}$.

In operation, a ramp-shaped voltage is applied to the input of a transconductance device, such as a MOS transistor, in output driver stage 23. The ramp-shaped voltage is produced by charging an internal capacitor from a current source. In the embodiment of FIG. 1 the current source is frequency-to-current converter 21, which produces currents $I_{CMP}$ and $I_{CMN}$ coupled to the inputs of respective p-channel (i.e., PMOS) and n-channel (i.e., NMOS) field-effect transistors in output driver stage 23.

According to the present invention, the transfer ratio of frequency-to-current converter 21 and the input capacitance of the output driver stage 23 are designed to produce a specified minimum transition delay for a specified maximum value of transient noise contribution. These specific transition delay and noise values are established using the input frequency, $F_{IN}$, applied to frequency-to-current converter 21. This input frequency may be obtained from the operating clock frequency of the integrated circuit (IC), the clock frequency of an external device or bus, or some multiple (or fraction) thereof. As such, the transition delay is calibrated or adjusted to the input frequency. Output driver 20 thus adapts to the input frequency applied to frequency-to-current converter 21. That is, as input frequency decreases (e.g., when the system clock frequency decreases) the transient noise voltage decreases to maintain optimum noise reduction for the new operating condition.

Figure 2:
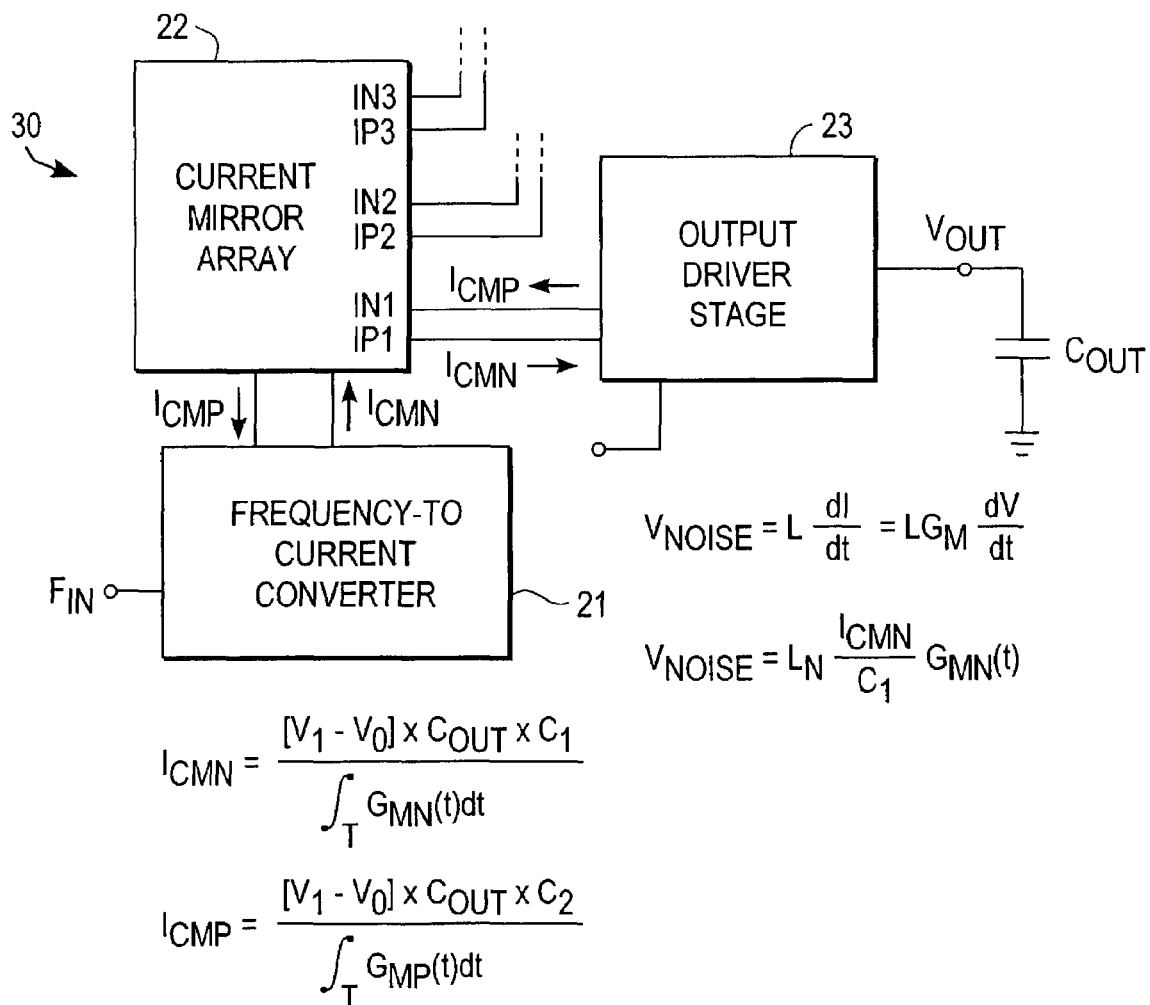
FIG. 2 is a block diagram of an output driver circuit according to another embodiment of the present invention.

FIG. 2 shows a block diagram of an output driver 30 according to another embodiment of the present invention. In this embodiment, frequency-to-current converter 21 is coupled to output driver stage 23 through a current mirror array 22. Current mirror array 22 mirrors the currents $I_{CMP}$ and $I_{CMN}$ of converter 21 to charge the input capacitor of one or more output driver stages 23 (i.e., coupled to IN1/IP1, IN2/IP2, IN3/IP3, etc.). The embodiment of FIG. 2 is therefore useful for driving the multiple output driver stages needed to drive a full 32-bit bus, a large memory array, or other similar external devices. Current mirror 22 may comprise any one of a variety of precision current mirror arrays, such as that disclosed in U.S. Pat. No. 6,166,670, which is herein incorporated by reference.

The equations included in FIG. 2 express the currents $I_{CMP}$ and $I_{CMN}$ as a function of the output capacitance, $C_{OUT}$, the respective internal charging capacitances of the output driver stage ($C_1$ & $C_2$), the transconductances ($G_{MN}$ & $G_{MP}$) of the n-channel and p-channel transistors (e.g., transistors 61 & 60, respectively, in FIG. 4), and the difference between the logic "1" and logic "0" voltage levels. In the case of CMOS circuitry, the term $V_1$ in the equation for $I_{CMN}$ is equal to Vdd, and $V_0$ represents the maximum logic zero voltage level. Conversely, in the equation for $I_{CMN}$, $V_0$ is equal to Vss and $V_1$ represents the minimum logic one voltage level. Practitioners in the art will understand that in the two noise equations shown in FIG. 2, L denotes the IC package inductance.

Figure 3:
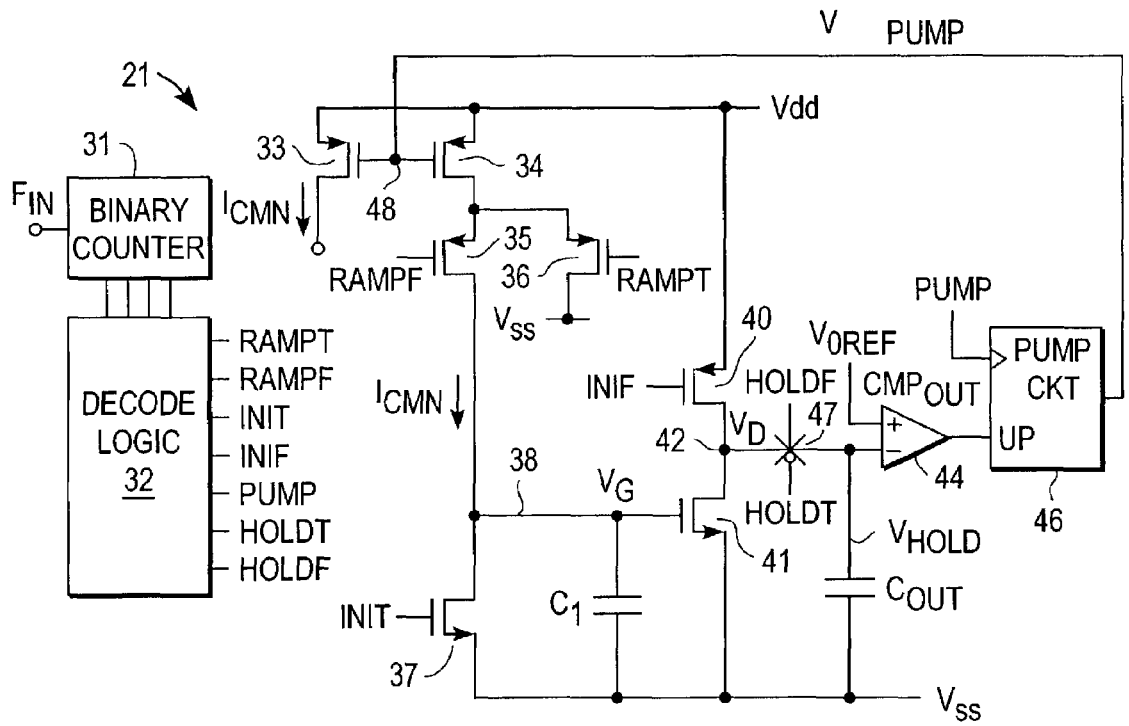
FIG. 3 is a detailed schematic diagram of a frequency-to-current converter circuit utilized in accordance with one embodiment of the present invention.

Referring now to FIG. 3, a detailed circuit schematic diagram of one embodiment of frequency-to-current converter 21 is shown. (Actually, only the circuitry utilized to generate current source $I_{CMN}$ is illustrated. The circuitry for generating $I_{CMP}$ is a complement of the circuitry shown in FIG. 3, configured to generate an appropriate current provided to the p-channel output driver stage device.) The operation of converter 21 is best understood in conjunction with the timing waveform shown in FIG. 5.

As shown in FIG. 3, a binary counter 31 is coupled to receive input frequency signal $F_{IN}$. Counter 31 has its outputs coupled to decode logic circuit 32. Decode logic circuit 32 utilizes the clock signals output by counter 31 (i.e., CLK/2, CLK/4, etc.) to generate the timing interval signals RAMPT, INIT, PUMP, and HOLDT, as well as their respective complementary logic signals RAMPF, INIF, and HOLDF. These timing signals are applied to various nodes in the circuit of FIG. 3 to produce the specified logic level at the specified delay interval. The delay interval is established from the rising edge of RAMPT to the rising edge of HOLDT (i.e., from $t_0$ to $t_1$ in FIG. 5). It is appreciated that in certain applications, decode logic circuit 32 may be omitted from converter 21, and the timing interval signals obtained directly from the outputs of counter 31.

Frequency-to-current converter 21 also includes a charge pump circuit 46, which produces an output voltage $V_{PUMP}$ that is coupled to the gates of p-channel transistors 33 and 34 at node 48. Transistors 33 and 34 are configured as a current mirror. The magnitude of current $I_{CMN}$, which flows through transistors 33 & 34, is determined by $V_{PUMP}$ and adjusted by feedback so that the output driver stage produces the specified logic level $V_{OUT}$ at the specified delay. The current $I_{CMN}$ through transistor 34 is switched either through p-channel transistor 35, or p-channel transistor 36, depending on the logical value of signal RAMPF and its complement signal, RAMPT, coupled to the gates of transistors 35 & 36, respectively. For instance, during a ramp interval when RAMPF is low (RAMPT is high) and INIT is low, the current $I_{CMN}$ is used to charge capacitor $C_1$ connected at node 38, producing a triangular shaped voltage waveform applied to the gate of n-channel transistor 41. At the end of a ramp interval, RAMPF transitions high and RAMPT transitions low, so that the current is switched to Vss through transistor 36. Transistor 37, which has its gate coupled to receive the INIT signal, is used to initialize capacitor $C_1$.

In FIG. 3, transistor 41 is coupled in series with p-channel transistor 40 between Vdd and Vss. Transistors 40 & 41 basically form a CMOS driver stage used to drive capacitor $C_{OUT}$ to a logic one and logic zero output voltage. Capacitor $C_{OUT}$ is shown connected to the negative input terminal of comparator 44. The gate of transistor 40 in coupled to timing signal INIF, such that when $C_1$ is charging (i.e., INIT low), INIF is high and transistor 40 is off. Capacitor $C_1$ discharges when INIT transitions high.

Continuing with the description of FIG. 3, the drain of transistor 41 is coupled to node 42, which is coupled through a CMOS transmission gate 47 to the negative input of comparator 44. Transmission gate 47 responds to the signals HOLDT and HOLDF to track and hold the waveform of the CMOS driver stage formed by transistors 40 & 41. Capacitor $C_{OUT}$ is also shown connected to the negative input terminal of comparator 44. Comparator 44 compares the voltage of $C_{OUT}$ to the logic zero voltage reference, $V_{0REF}$.

The discrete time feedback loop is completed by the connection of the output of comparator 44 to the UP input of pump circuit 46. In FIG. 3, pump circuit 46 is triggered by the PUMP input signal. The output of comparator 44 depends on the value of the residual voltage, $V_{HOLD}$, present on $C_{OUT}$. When $V_{HOLD}$ is higher than $V_{0REF}$, the comparator output CMPOUT transitions low, which, in turn, causes $V_{PUMP}$ to pump to a successively lower voltage level. A lower $V_{PUMP}$ value increases the current $I_{CMN}$ flowing through the current mirror formed by transistors 33 & 34. This larger current causes capacitor $C_1$ to be charged to a slightly larger voltage, which causes transistor 41 to discharge slightly more current out of $C_{OUT}$ during the timing interval, thereby lowering $V_{HOLD}$. In the opposite situation when $V_{HOLD}$ is lower than $V_{0REF}$, the current $I_{CMN}$ decreases so as to increase $V_{HOLD}$ until it matches $V_{0REF}$.

Figure 5:
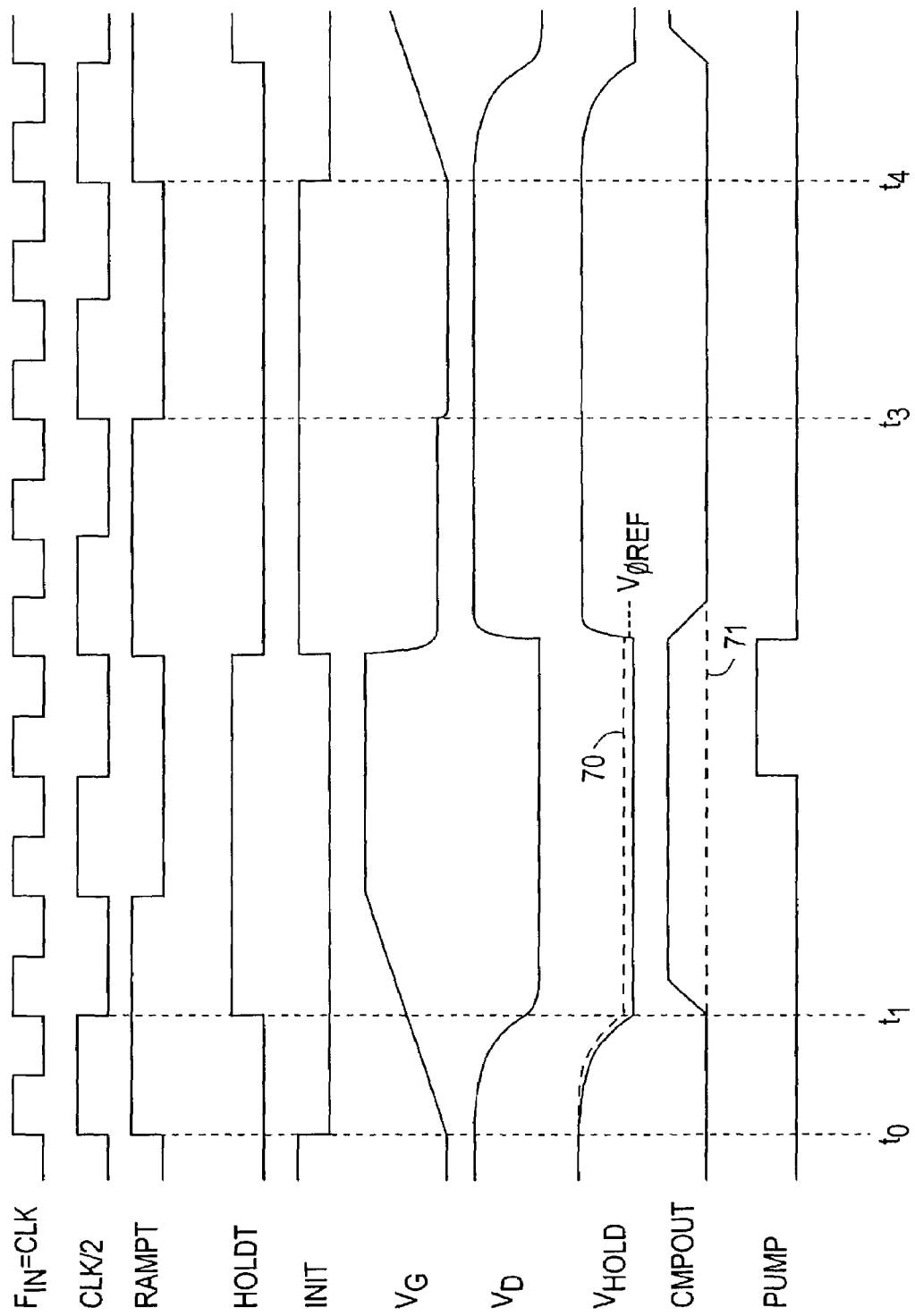
FIG. 5 is a timing waveform diagram illustrating the operation of the circuitry shown in FIG. 3.

With specific reference now to the timing diagram of FIG. 5, the clock frequency $F_{IN}$(=CLK) is divided using binary counter 31 to produce the signal CLK/2, as well as the other signals used by decode logic 32 to produce the digital waveforms that control frequency-to-current converter 21. For example, in FIG. 5, the RAMPT signal has a frequency of CLK/4, and the INIT signal has a frequency of CLK/8.

At the start of a calibration cycle the voltage $V_G$ (on $C_1$) is zero, and the voltage $V_{HOLD}$ (on $C_{OUT}$) is Vdd. At time $t_0$, RAMPT transitions high, INIT transitions low, and HOLDT remains low. The drain current of transistor 34 flows through the differential current switch formed by transistors 35 & 36 to charge capacitor $C_1$. This causes the gate voltage, $V_G$, of transistor 41 to increase as shown in FIG. 5. NMOS transistor 41 responds by conducting current to discharge $C_{OUT}$ (lowering $V_{HOLD}$). This charge is passed from $C_{OUT}$ to the drain of transistor 41 through transmission gate 47, which remains conductive.

The voltage $V_G$ increases until RAMPT transitions low. Meanwhile, the voltages $V_{HOLD}$ and $V_D$ decrease until HOLDT transitions high at time $t_1$, at which time transmission gate 47 stops conducting and $V_{HOLD}$ is held constant. At this point, comparator 44 compares the voltage $V_{HOLD}$ voltage to the logic zero reference voltage $V_{OREF}$. Since, in this example, $V_{HOLD}$ is held at a lower voltage than $V_{OREF}$, the comparison causes CMPOUT to transition to a logic one. In the event that $V_{HOLD}$ is higher than $V_{OREF}$, as shown by dashed line 70, CMPOUT would remain at (or transition to) the logic zero level, as shown by dashed line 71 in FIG. 5.

Another way of understanding the operation of the feedback loop is that if $I_{CMN}$ has sufficient magnitude, then waveform $V_G$ rises to a gate voltage that provides sufficient drive to transistor 41 to discharge $C_{OUT}$ to the specified voltage $V_{OREF}$. This results in a logic one output from comparator 44. Conversely, if $I_{CMN}$ has insufficient magnitude then waveform $V_G$ rises to a gate voltage that provides insufficient drive to transistor 41 to discharge $C_{OUT}$ to the specified voltage $V_{OREF}$. This condition causes comparator 44 to output a logic zero voltage.

Note that in FIG. 5 the signal PUMP is shown transitioning from logic zero to logic one at the end of the third clock cycle of $F_{IN}$. This insures that comparator 44 has adequate time to respond to the input voltage $V_{HOLD}$.

At the end of the calibration interval, PUMP transitions low and INIT transitions high. This starts the discharge of capacitor $C_1$ and turns transistor 41 off. Simultaneously, INIF transitions low to turn on transistor 41, which, in turn, charges $C_{OUT}$ to Vdd. At time $t_3$, RAMPT transitions low, and the drain current $I_{CMN}$ of transistor 34 is conducted by the differential switch to Vss. This results in a further decrease in the voltage $V_G$ across $C_1$. This small offset voltage improves the accuracy of subsequent calibration cycles. In the example of FIG. 5, the calibration cycle is repeated, starting at time $t_4$.

Figure 4:
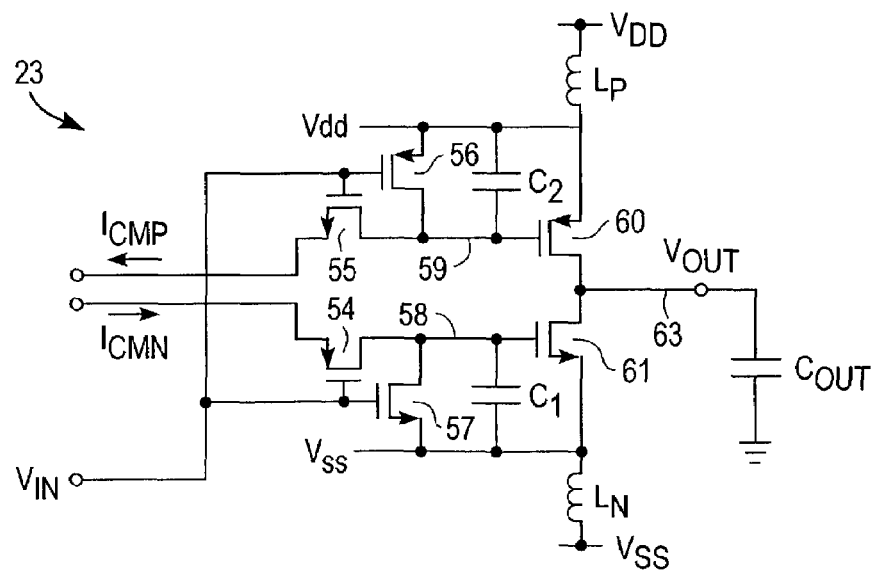
FIG. 4 is a circuit schematic diagram of an output driver stage utilized in accordance with one embodiment of the present invention.

FIG. 4 is a detailed circuit schematic diagram of output driver stage 23, which includes p-channel output transistor 60 coupled in series with n-channel output transistor 61 between Vdd and Vss. The package inductances $L_P$ and $L_N$ are shown included in the respective paths between the on-chip supply lines Vdd and Vss and the off-chip, external power supply lines $V_{DD}$ and $V_{SS}$.

Beginning with a description of the lower half of the output driver stage, the n-channel drive current $I_{CMN}$ is switched through p-channel transistor 54 by the input logic voltage $V_{IN}$. That is, when is $V_{IN}$ transitions from a logic high to a logic low, n-channel transistor 57 turns off, transistor 54 turns on. The current $I_{CMN}$ then flows into node 58 to charge capacitor $C_1$, which is coupled between the gate of n-channel output transistor 61 and Vss. This results in a ramp-shaped charging voltage being produced at the gate of output transistor 61, which becomes conductive to discharge external capacitor $C_{OUT}$ (coupled to the drains of output transistors 60 & 61 at node 63) to $V_{SS}$.

Note that when $V_{IN}$ is low, transistor 55 is off and transistor 56 is turned on, causing capacitor $C_2$ coupled to node 59 to charge to Vdd. The presence of a high voltage level at node 59 means that p-channel output transistor 60 is off.

When $V_{IN}$ transitions logically high, transistors 54 & 56 turn off, and transistors 55 and 57 begin conducting. This causes capacitor $C_2$ to charge to a low voltage by means of p-channel drive current $I_{CMP}$. At the same time, capacitor $C_1$ discharges through transistor 57. The result is a ramp-shaped discharging voltage produced at the gate of output transistor 60, which becomes conductive to charge external capacitor $C_{OUT}$ to $V_{DD}$.

Practitioners in the art will understand that the upper and lower circuit structures of the output driver stage 23 are replicated in the circuitry of frequency-to-current converter 21 that produces the respective p-channel and n-channel currents. For instance, the configuration of n-channel transistors 57 & 61 and capacitors $C_1$ and $C_{OUT}$ in FIG. 4 is replicated in FIG. 3 by the same configuration of transistors 37 & 41 and capacitors $C_1$ and $C_{OUT}$.

Note, however, that in the embodiment of FIG. 4, $C_{OUT}$ is an off-chip, external capacitance, whereas in the circuit of FIG. 3, $C_{OUT}$ may either be replicated as an on-chip capacitance, or comprise an off-chip, external capacitance. In the latter case, an additional package pin may be needed for connection to this replicated capacitance. The capacitors $C_1$ and $C_2$ are on-chip devices in the embodiments described above.

It is further appreciated that in other embodiments, the frequency-to-current converter circuitry may be made operate at a lower frequency, e.g., some fraction of the system clock or data rate. In such embodiments, the capacitances C1, C2, and $C_{OUT}$ of converter 23 are appropriately scaled along with the device sizes of the associated transistors. Other circuit and device configurations are also possible.

Figure 6:
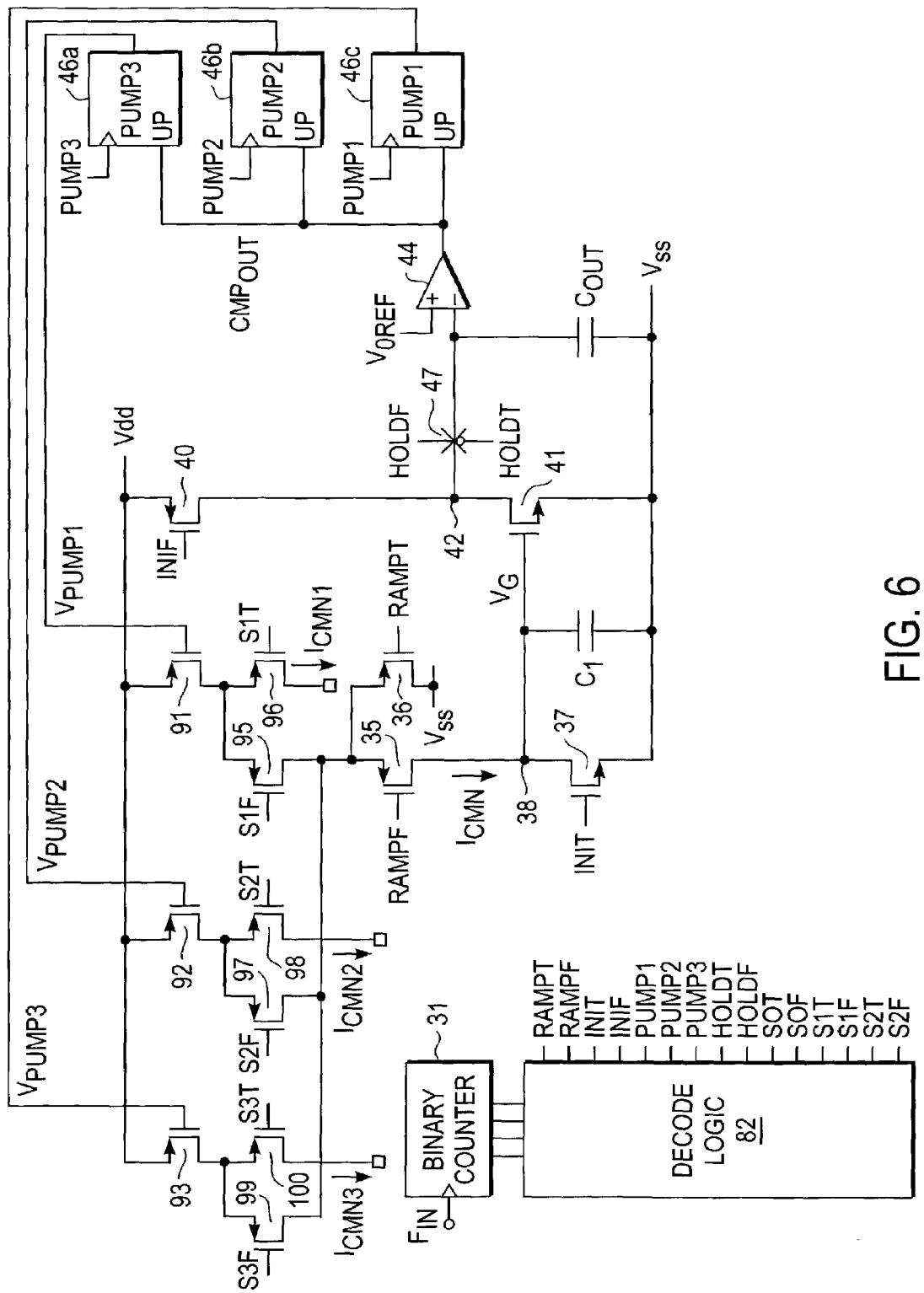
FIG. 6 is a schematic diagram of a circuit that incorporates a frequency-to-current converter and a current mirror array in accordance with another embodiment of the present invention.

FIG. 6 illustrates a schematic diagram of a circuit that incorporates a frequency-to-current converter and a current mirror array in accordance with another embodiment of the present invention. Note that the frequency-to-converter portion includes the same basic circuit structure shown previously in FIG. 3. In the circuit of FIG. 6, however, comparator 44 is coupled to the UP input of three separate pump circuits 46a–46c, each of which provides an output voltage, $V_{PUMP1-3}$, to produce the currents, $I_{CMN1-3}$, of the current mirror array portion of the circuit. Each of the pump circuits 46 is triggered by a corresponding $PUMP_{1-3}$ input timing signal. The feedback voltage signal $V_{PUMP1}$ is coupled to the gate of p-channel transistor 91, $V_{PUMP2}$ is coupled to the gate of p-channel transistor 92, and $V_{PUMP3}$ is coupled to the gate of p-channel transistor 93.

Each of the transistors 91–93 is coupled in series between Vdd and a differential pair of switching transistors. For instance, the drain of transistor 91 is connected to the commonly coupled sources of transistors 95 & 96. Complementary switching signals S1T and S1F are shown connected to the respective gates of transistors 96 and 95 to control the current flow direction. When S1T is low, S1F is high, transistor 96 conducts, and transistor 95 is nonconductive. This results in current $I_{CMN1}$ flowing through transistor 96 to the corresponding output driver stage. The opposite switching state (S1T high, S1F low) causes the current from transistor 91 to be directed to the differential switching pair of transistors 35 & 36 of the frequency-to-current converter portion of the circuit.

Transistor pairs 97 & 98 and 99 & 100 function in the same manner as described above to direct the mirrored currents either to the corresponding output driver stages or back through transistors 35 & 36 of the frequency-to-current converter circuitry. Note that the example of FIG. 6, the switching signals S1T/S1F, S2T/S2F, and S3T/S3F are generated by decode logic block 82, which is driven by binary counter 31.

It should be understood that although the present invention has been described in conjunction with specific embodiments, numerous modifications and alterations are well within the scope of the present invention. Accordingly, the specification and drawings are to be regarded in an illustrative rather than a restrictive sense

I claim:

1. An output driver comprising:
   an output stage that includes a first transistor configured to drive a capacitive load, and a first capacitor coupled to an input of the first transistor; and a converter to convert an input clock signal having a frequency into a current, the current being provided to charge the first capacitor during a specified interval, the converter including a feedback loop to adjust the current so as to produce a specified logic level at the specified interval, the feedback loop comprising circuitry that includes a second transistor to drive a second capacitor, and a third capacitor coupled to the input of the second transistor, the second transistor and the second and third capacitors being configured to replicate the first transistor, the capacitive load, and the first capacitor, respectively, of the output driver stage.

2. The output driver of claim 1 wherein the feedback loop further comprises:
a pair of MOS transistors configured as a current mirror, each of the MOS transistors conducting the current, with a magnitude of the current being determined by a pump voltage applied to the gates of the MOS transistors;
a pump circuit to generate the pump voltage; and
a comparator having an output coupled to drive the pump circuit, a first input coupled to a reference voltage equal to the specified logic level, and a second input coupled to the second capacitor.

3. The output driver according to claim 1 wherein the specified logic level is produced at the drain of the second transistor.

4. The output driver according to claim 1 wherein the specified interval is derived from the frequency of the input clock signal.

5. An output driver comprising:
an output stage that includes a first PMOS transistor coupled in series with a first NMOS transistor between upper and lower supply potentials, the drain of the first NMOS transistor being coupled to drive an external capacitive load, the output stage further including a first capacitor coupled between the gate of the first NMOS transistor and the lower supply potential; and
a converter to convert an input clock signal having a frequency into a current, the current being provided to charge the first capacitor during a specified interval, the converter including a feedback loop to adjust the current so as to produce a specified logic level at the specified interval, the feedback loop including a second NMOS transistor to drive a second capacitor, and a third capacitor coupled to the input of the second NMOS transistor, the second NMOS transistor and the second and third capacitors being configured to replicate the first NMOS transistor, the external capacitive load, and the first capacitor, respectively, of the output driver stage.

6. The output driver of claim 5 wherein the specified interval is derived from the frequency of the input clock signal.

7. The output driver of claim 6 wherein the specified interval is equal to a clock period of the input clock signal.

8. The output driver of claim 5 wherein the output stage further includes a third NMOS transistor coupled between the gate of the first NMOS transistor and the lower supply potential, the third NMOS transistor discharging the first capacitor responsive to a first input logic signal.

9. The output driver of claim 5 wherein the converter further comprises a logic circuit that receives the input clock signal and generates a plurality of timing signals therefrom.

10. The output driver according to claim 9 wherein the logic circuit comprises a binary counter having one or more outputs.

11. The output driver according to claim 9 wherein the logic circuit further comprises decode logic that generates the plurality of timing signals from the one or more outputs of the binary counter.

12. The output driver according to claim 5 wherein the feedback loop further includes a fourth NMOS transistor coupled between the gate of the second NMOS transistor and the lower supply potential, the third NMOS transistor discharging the second capacitor responsive to a first timing signal.

13. The output driver of claim 5 wherein the feedback loop further comprises:
a pair of PMOS transistors configured as a current mirror, each of the PMOS transistors conducting the current, with a magnitude of the current being determined by a pump voltage applied to the gates of the PMOS transistors;
a pump circuit to generate the pump voltage; and
a comparator having an output coupled to drive the pump circuit, a first input coupled to a reference voltage equal to the specified logic level, and a second input coupled to the second capacitor.

14. The output driver according to claim 5 further comprising a current mirror array to mirror the current such that the current is provided to the output stage and to one or more additional output stages.

15. An output driver comprising:
an output stage that includes:
first and second input current nodes;
a first PMOS transistor coupled in series with a first NMOS transistor between upper and lower supply potentials, the drains of the first PMOS and NMOS transistors being coupled to drive an external capacitive load;
a first capacitor coupled between the gate of the first NMOS transistor and the lower supply potential;
a second capacitor coupled between the gate of the first PMOS transistor and the upper supply potential;
a converter to convert an input clock signal having a frequency into first and second currents, the first and second currents being respectively provided to charge the first and second capacitors during a specified interval, the converter including first and second feedback loops to adjust the first and second currents so as to produce first and second specified logic levels, respectively, at the specified interval, the first feedback loop including a first circuit portion that replicates the first NMOS transistor, the external capacitive load, and the first capacitor of the output stage, the first feedback loop including a second circuit portion that replicates the first PMOS transistor, the external capacitive load, and the second capacitor of the output stage.

16. The output driver according to claim 15 wherein the output stage further comprises switching circuitry configured to discharge the first capacitor and connect the gate of the first PMOS transistor to the first input current node responsive to a first input logic signal, and to discharge the second capacitor and connect the gate of the first NMOS transistor to the second input current node responsive to a second input logic signal.

17. The output driver of claim 15 wherein the specified interval is derived from the frequency of the input clock signal.

18. The output driver of claim 17 wherein the specified interval is equal to a clock period of the input clock signal.

19. The output driver of claim 15 wherein the converter further comprises a logic circuit that receives the input clock signal and generates a plurality of timing signals therefrom.

20. The output driver according to claim 19 wherein the logic circuit comprises a binary counter having one or more outputs.

21. The output driver according to claim 20 wherein the logic circuit further comprises decode logic that generates the plurality of timing signals from the one or more outputs of the binary counter.

22. The output driver of claim 15 wherein the first feedback loop further comprises:
   a pair of PMOS transistors configured as a current mirror, each of the PMOS transistors conducting the first current, a magnitude of the current being determined by a first pump voltage applied to the gates of the pair of PMOS transistors;
   a first pump circuit to generate the first pump voltage; and
   a first comparator having an output coupled to drive the first pump circuit, a first input coupled to a reference voltage equal to the first specified logic level, and a second input coupled to the first capacitor.

23. The output driver of claim 22 wherein the first feedback loop further comprises:
   a pair of NMOS transistors configured as a current mirror, each of the NMOS transistors conducting the second current, a magnitude of the second current being determined by a first pump voltage applied to the gates of the pair of NMOS transistors;
   a second pump circuit to generate the second pump voltage; and
   a second comparator having an output coupled to drive the second pump circuit, a first input coupled to a reference voltage equal to the second specified logic level, and a second input coupled to the second capacitor.

24. The output driver according to claim 15 further comprising a current mirror array to mirror the first and second currents such that the first and second currents are provided to the output stage and to one or more additional output stages.

* * * * *